(12) United States Patent
Wada et al.

(10) Patent No.: US 7,607,216 B2
(45) Date of Patent: Oct. 27, 2009

(54) METHOD FOR MANUFACTURING MONOLITHIC CERAMIC ELECTRONIC COMPONENT

(75) Inventors: Ryuichiro Wada, Kyoto (JP); Tetsuya Ikeda, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 192 days.

(21) Appl. No.: 11/735,577

(22) Filed: Apr. 16, 2007

(65) Prior Publication Data

US 2007/0180684 A1 Aug. 9, 2007

Related U.S. Application Data

(63) Continuation of application No. PCT/JP2005/009132, filed on May 19, 2005.

(30) Foreign Application Priority Data

Oct. 18, 2004 (JP) .............................. 2004-302432

(51) Int. Cl.
*H01F 7/06* (2006.01)

(52) U.S. Cl. .................. 29/606; 29/602.1; 29/604; 29/605; 29/840; 228/175; 228/180.22; 228/219; 336/110; 336/175; 336/178; 336/184; 336/200

(58) Field of Classification Search ............... 29/602.1, 29/604–607, 840; 336/110, 175, 178, 184, 336/200, 214, 215, 234; 228/175, 180.22, 228/219
See application file for complete search history.

(56) References Cited

U.S. PATENT DOCUMENTS

| 6,108,192 | A | 8/2000 | Sugimoto et al. |
| 6,160,469 | A | 12/2000 | Liberatore et al. |
| 6,191,934 | B1 | 2/2001 | Liberatore et al. |
| 6,293,001 | B1 | 9/2001 | Uriu et al. |
| 6,631,545 | B1 | 10/2003 | Uriu et al. |
| 6,909,350 | B2 | 6/2005 | Uriu et al. |
| 6,911,887 | B1 | 6/2005 | Uriu et al. |
| 6,911,888 | B2 | 6/2005 | Uriu et al. |
| 6,914,510 | B2 | 7/2005 | Uriu et al. |
| 7,078,999 | B2 | 7/2006 | Uriu et al. |
| 2005/0156698 | A1* | 7/2005 | Pleskach et al. ............. 336/200 |
| 2005/0190036 | A1 | 9/2005 | Uriu et al. |

FOREIGN PATENT DOCUMENTS

JP 05-055044 A 3/1993

(Continued)

OTHER PUBLICATIONS

Official communication issued in the corresponding International Application No. PCT/JP2005/009132, mailed on Sep. 6, 2005.

(Continued)

*Primary Examiner*—Paul D Kim
(74) *Attorney, Agent, or Firm*—Keating & Bennett, LLP (57) ABSTRACT

A multilayer composite including a core made of a magnetic ceramic sintered compact disposed therein, and shrinkage restraining layers including an inorganic powder that is not substantially sintered at the sintering temperature of the green ceramic layers are sintered in order to reduce the difference in shrinkage behavior during firing between the core and the green ceramic layers.

14 Claims, 10 Drawing Sheets

FOREIGN PATENT DOCUMENTS

| | | |
|---|---|---|
| JP | 06-077074 A | 3/1994 |
| JP | 06-151182 A | 5/1994 |
| JP | 06-283335 A | 10/1994 |
| JP | 07-176444 A | 7/1995 |
| JP | 08-138941 A | 5/1996 |
| JP | 09-181450 A | 7/1997 |
| JP | 09-251915 A | 9/1997 |
| JP | 2785544 B2 | 8/1998 |
| JP | 10-294218 A | 11/1998 |
| JP | 10-303043 A | 11/1998 |
| JP | 10-335142 A | 12/1998 |
| JP | 11-228222 A | 8/1999 |
| JP | 11-260642 A | 9/1999 |
| JP | 11-340039 A | 12/1999 |
| JP | 2000-150239 A | 5/2000 |
| JP | 2001-156454 A | 6/2001 |
| JP | 2001-196253 A | 7/2001 |
| JP | 2003-238259 A | 8/2003 |
| JP | 2003-324033 A | 11/2003 |
| JP | 2004-103623 A | 4/2004 |
| JP | 2004-128522 A | 4/2004 |
| JP | 2005-039071 A | 2/2005 |

OTHER PUBLICATIONS

Official communication issued in counterpart Japanese Application No. 2006-542240, mailed on Nov. 25, 2008.

* cited by examiner

METHOD FOR MANUFACTURING MONOLITHIC CERAMIC ELECTRONIC COMPONENT

This is a continuation of application PCT/JP05/09132 filed May 19, 2005.

BACKGROUND OF THE INVENTION

1. Field of the Invention

The present invention relates to a method for manufacturing a monolithic ceramic electronic component including a coil conductor, and a multilayer composite prepared for manufacturing the monolithic ceramic electronic component.

2. Description of the Related Art

Monolithic ceramic electronic components including an inductor element as disclosed in Japanese Unexamined Patent Application Publication Nos. 11-260642 (Patent Document 1) and 2000-150239 (Patent Document 2) are related to the present invention. In order to manufacture a monolithic ceramic electronic component including an inductor element, Patent Documents 1 and 2 disclose a process including the step of preparing a green stack including a green core primarily including a green magnetic material, a coil conductor made of a green electroconductive paste film around the green core, and green outer layers primarily including a green non-magnetic material surrounding the green core and the coil conductor, and the step of firing the green stack at one time.

However, since the firing step in the manufacturing process of a monolithic ceramic electronic component disclosed in Patent Document 1 or 2 fires different types of materials at one time, a constituent (for example, Ag or other constituent) included in, for example, the electroconductive paste film provided for the coil conductor may diffuse into the core, or constituents (for example, Fe, Ni, and other constituents) included in the green core may diffuse into the outer layers. Diffusion of these constituents into the core, the coil conductor, and the outer layers frequently prevents these components from exhibiting their inherent characteristics. For example, the inductor element may not exhibit desired characteristics in the resulting monolithic ceramic electronic component.

SUMMARY OF THE INVENTION

In order to overcome the problems described above, preferred embodiments of the present invention provide a method for manufacturing a monolithic ceramic electronic component and a multilayer composite prepared for the manufacture of the monolithic ceramic electronic component which overcome the problems described above.

A manufacturing method of the monolithic ceramic electronic component according to a preferred embodiment of the present invention includes the step of forming a multilayer composite that includes a core made of a magnetic ceramic sintered compact, a coil conductor formed around the core, at least two green ceramic layers between which the core and the coil conductor are disposed, and a shrinkage restraining layer in contact with a specific one of the green ceramic layers and including an inorganic material powder that is not substantially sintered at the sintering temperature of the green ceramic layers, and the step of firing the multilayer composite at a temperature that can sinter the green ceramic layers.

Preferably, the step of forming the multilayer composite includes the step of preparing the core, the step of preparing a plurality of ceramic green sheets for the green ceramic layers, the step of forming a first conductor pattern for a portion of the coil conductor on a first main surface of a first one of the ceramic green sheets, the step of forming a second conductor pattern for another portion of the coil conductor on a first main surface of a second one of the ceramic green sheets, and the step of stacking the first ceramic green sheet and the second ceramic green sheet such that the first main surface of the first ceramic green sheet is opposed to the first main surface of the second ceramic green sheet with the core therebetween, and such that the ends of the first conductor pattern are in contact with the ends of the second conductor pattern to form a conductor having a coil shape.

Preferably, the step of stacking the first ceramic green sheet and the second ceramic green sheet includes disposing the core on the first main surface of the first ceramic green sheet such that the ends of the first conductor pattern protrude from the core, and stacking the second ceramic green sheet on the first ceramic green sheet with the core therebetween.

Preferably, the step of forming the multilayer composite further includes the step of forming the shrinkage restraining layer on a second main surface of the first ceramic green sheet opposite the first main surface and a second main surface of the second ceramic green sheet opposite the first main surface.

Preferably, each of the first and second conductor patterns includes a plurality of conductive strips, such that the coil conductor has a plurality of turns.

In the method for manufacturing the monolithic ceramic electronic component according to a preferred embodiment of the present invention, the core may be in any form, such as a flat plate, a circular cylinder, an elliptic cylinder, or a ring.

The shrinkage restraining layer may be disposed in any position of the multilayer composite. If the shrinkage restraining layer defines an outermost layer of the multilayer composite, preferably the method further includes the step of removing the shrinkage restraining layer. If the shrinkage restraining layer is disposed along a specific interface of the green ceramic layers, preferably the shrinkage restraining layer is solidified by permeation of a portion of the constituents of the green ceramic layers in the firing step. In this case, an additional shrinkage restraining layer may be formed so as to define an outermost layer of the multilayer composite.

Preferably, the multilayer composite further includes first shield plates made of a magnetic ceramic sintered compact disposed along specific interfaces of the green ceramic layers such that the core and the coil conductor are disposed between the first shield plates in the stacking direction. In this instance, more preferably, the multilayer composite further includes second shield plates made of a magnetic ceramic sintered compact disposed at the interface of the green ceramic layers between which the core and the coil conductor are disposed, in such a manner that the core and the coil conductor are disposed between the second shield plates.

The monolithic ceramic electronic component manufactured by the method according to preferred embodiments of the present invention may be a single-function element that functions as an inductor, or a multilayer ceramic substrate having a plurality of functions including a function as an inductor. Preferably, in the former case, the green ceramic layers primarily include a low-temperature co-fired ceramic material or a magnetic material. Preferably, in the latter case, the green ceramic layers primarily include a low-temperature co-fired ceramic material.

Another preferred embodiment of the present invention is directed to a multilayer composite prepared for manufacturing a monolithic ceramic electronic component including an inductor element.

The multilayer composite according to a preferred embodiment of the present invention includes a core made of a magnetic ceramic sintered compact, a coil conductor disposed around the core, at least two green ceramic layers stacked with the core and the coil conductor therebetween, and a shrinkage restraining layer disposed along a specific one of the green ceramic layers. The shrinkage restraining layer includes an inorganic material powder that is not substantially sintered at the sintering temperature of the green ceramic layers. A monolithic ceramic electronic component is produced through the step of firing the multilayer composite.

In the multilayer composite according to a preferred embodiment of the present invention, preferably, the green ceramic layers include a first ceramic layer and a second ceramic layer between which the core and the coil conductor are disposed, and the coil conductor includes a first conductor pattern and a second conductor pattern on opposed main surfaces of the first and second green ceramic layers, respectively. The ends of the first and second conductor patterns are in contact with each other so as to define a conductor having a coil shape.

According to preferred embodiments of the present invention, since the multilayer composite to be fired includes the core made of the magnetic ceramic sintered compact, constituents do not substantially diffuse between the core and the coil conductor and green ceramic layers in the firing step. As a result, the core made of a magnetic ceramic sintered compact maintains its inherent characteristics. Accordingly, the inductor element including the core and the coil conductor exhibits intended characteristics in the resulting monolithic ceramic electronic component.

The multilayer composite includes the core made of a sintered compact and the green ceramic layers. Since the green ceramic layers tends to shrink a relatively large amount, the difference in shrinkage between the core and the green ceramic layers produces a relatively large internal stress in the multilayer composite which may cause a warp, a wave, or a crack after firing. However, in various preferred embodiments of the present invention, the multilayer composite includes the shrinkage restraining layer to prevent the green ceramic layers from shrinking, and substantial shrinkage of the green ceramic layers in the main surface direction does not occur. Accordingly, the above-mentioned warp, wave, or crack is prevented, and the monolithic ceramic electronic component can be manufactured with a high yield.

In preferred embodiments of the present invention, since the green ceramic layers and the shrinkage restraining layer, except the core, are not sintered in the multilayer composite, the core can be provided inside the multilayer composite without forming a cavity. Accordingly, the method does not require relatively complicated steps, such as forming a cavity and disposing the core in the cavity. The process is therefore simplified and the cost is reduced.

According to preferred embodiments of the present invention, the magnetic permeability of the core in the multilayer composite can be arbitrarily selected. Consequently, the inductance can be controlled not only by varying the number of turns of the coil conductor, but also by varying the magnetic permeability. Thus, the inductance of the inductor element can be controlled over a wide range.

According to preferred embodiments the present invention, cores having different magnetic permeabilities can be disposed in the same plane of the monolithic ceramic electronic component. It is therefore not necessary for the wiring conductors for connecting the coil conductors to be provided in a plurality of ceramic layers. Accordingly, the load on the wiring conductors can be reduced and stable characteristics can be ensured. The resulting monolithic ceramic electronic component can be used in heavy-current applications, such as in a power source. Also, a low-profile monolithic ceramic electronic component can be provided.

In order to form the multilayer composite in preferred embodiments of the present invention, the following steps are performed: forming a first conductor pattern for a portion of the coil conductor on a first main surface of a first ceramic green sheet, a second conductor pattern intended for the another portion of the coil conductor on a first main surface of a second ceramic green sheet, and stacking the first ceramic green sheet and the second ceramic green sheet such that the first main surface of the first ceramic green sheet opposes the first main surface of the second ceramic green sheet with the core therebetween, and such that the ends of the first conductor pattern come into contact with the ends of the second conductor pattern to form a conductor in a coil form. With these steps, the conductor having a coil shape can be provided without forming a via hole conductor in a specific ceramic green sheet. Accordingly, the step of forming a via hole conductor is not required, and thus, the manufacturing cost of the monolithic ceramic electronic component is reduced.

When a multilayer composite is formed as described above, the coil conductor formed around the core is in close contact with the core, such that the magnetic flux generated is completely confined and the inflection point of the magnetic field is reduced. Thus, a low-loss inductor element is provided.

In the above-described preferred embodiment, if each of the first and second conductor patterns each has a plurality of conductive strips, the resulting coil conductor can easily have a plurality of turns. In this instance, the pitch of the plurality of conductive strips can be reduced without limitations on the size of the via hole conductor. If the conductive strips are formed by screen printing, the pitch of the conductive strips depends on only the printing characteristics of screen printing, and can be reduced to, for example, about 30 μm. Accordingly, the size of the coil conductor, and thus the size of the monolithic ceramic electronic component, can be reduced.

In the formation of the multilayer composite according to the above-described preferred embodiment, if the step of stacking the first ceramic green sheet and the second ceramic green sheet is performed by disposing the core on the first main surface of the first ceramic green sheet such that the ends of the first conductor pattern protrude from the core, and then by stacking the second ceramic green sheet on the first ceramic green sheet with the core therebetween, the multilayer composite is formed by stacking its members one after another from one side in the stacking direction. Thus, the multilayer composite can be prepared without using a complicated process.

In preferred embodiments of the present invention, if the multilayer composite further includes first shield plates made of a magnetic ceramic sintered compact along specific interfaces of the ceramic green sheets such that the core and the coil conductor are disposed between the first shield plates in the stacking direction, the first shield plates and the shrinkage restraining layer prevent shrinkage in the firing step. In addition, the lines of magnetic force can be confined to run from the inductor element including the core and the coil conductor in the stacking direction. Consequently, elements disposed around the inductor element which are readily affected by the magnetic field, such as a transformer, are shielded, and the loss is reduced.

If the multilayer composite further includes second shield plates made of a magnetic ceramic sintered compact at the interface of the green ceramic layers between which the core and the coil conductor are disposed, such that the core and the coil conductor are disposed between the second shield plates, the confinement of the lines of magnetic field is further improved, and the loss of the inductor element is further reduced.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 2A and 2B show representations of a first ceramic green sheet prepared for manufacturing the inductor element shown in FIG. 1, wherein FIG. 2A is a plan view, and 2B is a sectional view taken along line B-B of FIG. 2A.

FIGS. 3A and 3B show representations of the state where a core is disposed on the first ceramic green sheet shown in FIGS. 2A and 2B, wherein FIG. 3A is a plan view, and FIG. 3B is a sectional view taken along line B-B of FIG. 3A.

FIGS. 4A and 4B show representations of a second ceramic green sheet prepared for manufacturing the inductor element shown in FIG. 1, wherein FIG. 4A is a plan view, and FIG. 4B is a sectional view taken line B-B of FIG. 4A.

FIGS. 5A and 5B show representations of a multilayer composite formed by stacking the structure shown in FIGS. 3A and 3B and the structure shown in FIGS. 4A and 4B, wherein FIG. 5A is a plan view, and FIG. 5B is a sectional view taken along line B-B of FIG. 5A.

DETAILED DESCRIPTION OF PREFERRED EMBODIMENTS

Figure 1:
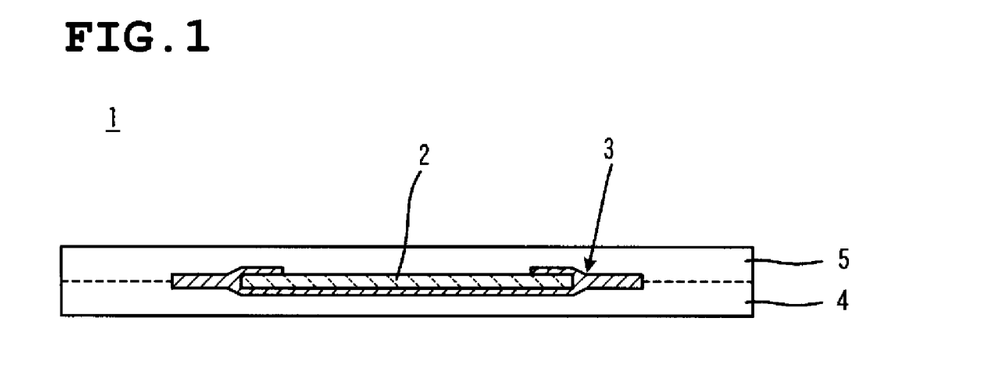
FIG. 1 is a sectional view of an inductor element according to a first preferred embodiment of the monolithic ceramic electronic component manufactured by a manufacturing method of the present invention.

FIG. 1 is a sectional view of an inductor element 1 according to a first preferred embodiment of the monolithic ceramic electronic component manufactured by a manufacturing method of the present invention.

Referring to FIG. 1, the inductor element 1 includes a core 2 made of a sintered compact of magnetic ceramic, such as ferrite, a coil conductor 3 disposed around the core 2, and two ceramic layers 4 and 5 between which the core 2 and the coil conductor 3 are disposed. The inductor element 1 is manufactured by a method described with reference to FIGS. 2A to 5B.

In each of FIGS. 2A to 5B, A is a plan view and B is a sectional view taken along line B-B of the respective plan view A.

Figure 2A:
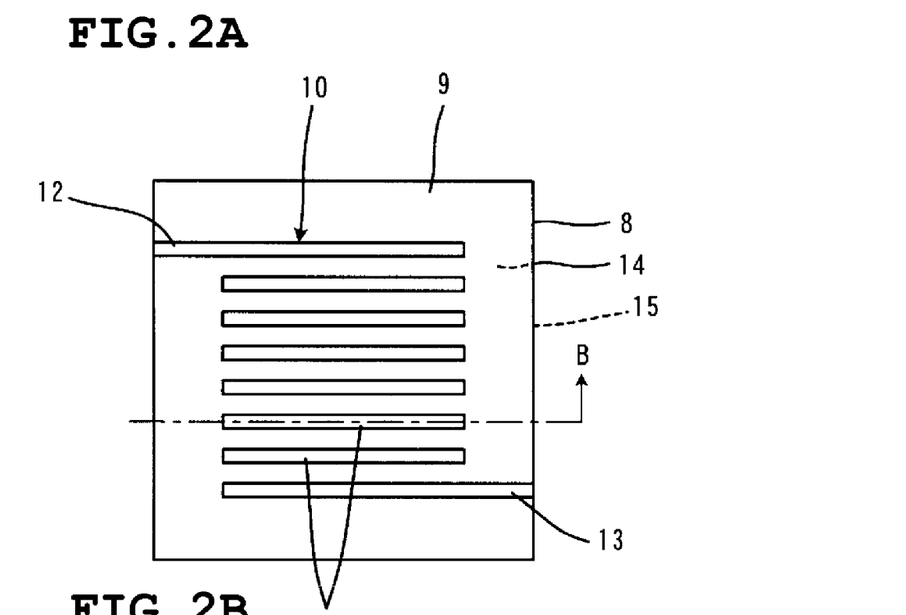
Figure 2B:
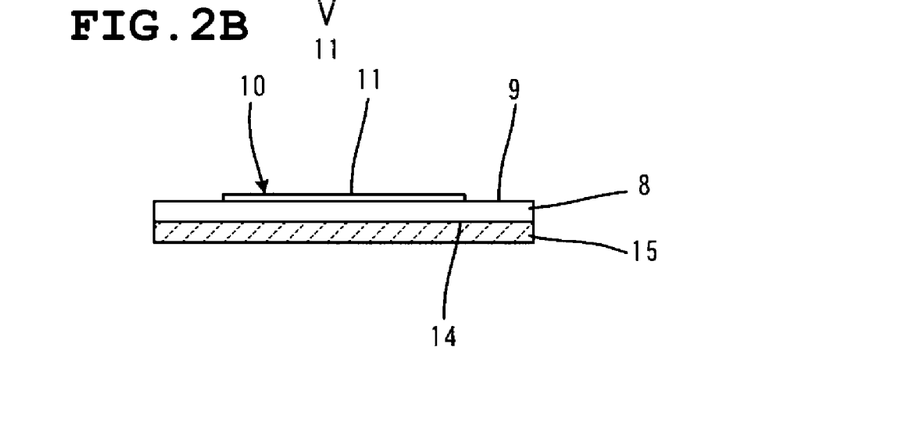

Referring first to FIGS. 2A and 2B, a first ceramic green sheet 8 for the ceramic layer 4 is prepared. Preferably, the first ceramic green sheet 8 primarily includes a low-temperature co-fired ceramic material. For example, the first ceramic green sheet 8 is formed in a sheet by casting method using a slurry prepared by dispersing a mixture of alumina powder and borosilicate glass powder in an organic vehicle.

The first ceramic green sheet 8 may primarily include, for example, a magnetic material, such as ferrite, instead of the above mentioned low-temperature co-fired ceramic material.

A first conductor pattern 10 for a portion of the coil conductor 3 is formed on a first main surface 9 of the first ceramic green sheet 8. The first conductor pattern 10 is preferably formed by screen-printing using an electroconductive paste. The first conductor pattern 10 includes a plurality of conductive strips 11 arranged substantially parallel to each other. The number of conductive strips 11 is selected according to a desired inductance. The line/space of the conductive strips 11 are also selected in the range of about 30 μm to about 2000 μm according to the desired inductance.

The first conductor pattern 10 also includes input/output terminals 12 and 13 connected to the conductive strips disposed at the ends of the arrangement of the conductive strips 11. The input/output terminals 12 and 13 extend to edges of the first ceramic green sheet 8.

A shrinkage restraining layer 15 is provided on a second main surface 14 of the first ceramic green sheet 8 opposite the first main surface 9. The shrinkage restraining layer 15 is preferably made of a material including an inorganic powder that is not substantially sintered at the sintering temperature of the first ceramic green sheet 8, such as alumina powder. For example, the material of the shrinkage restraining layer is made of a slurry prepared by dispersing alumina powder in an organic vehicle.

The shrinkage restraining layer 15 may be provided by stacking a green sheet formed by casting method using the slurry on the second main surface 14 of the first ceramic green sheet 8, or may be provided by applying the slurry onto the second main surface 14 of the second ceramic green sheet 8.

Figure 3A:
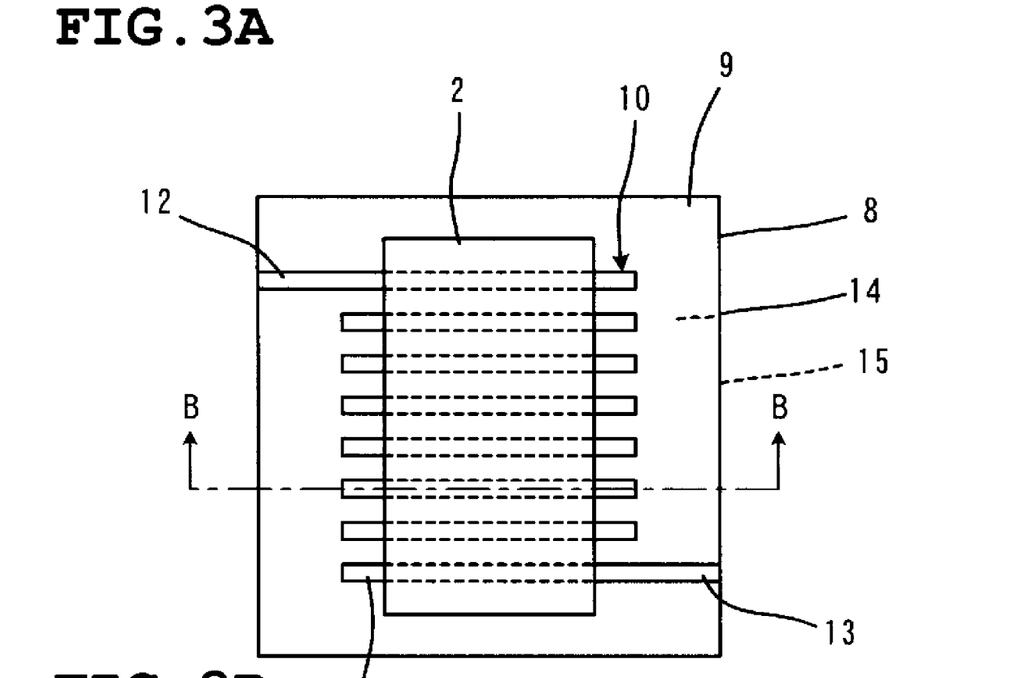
Figure 3B:
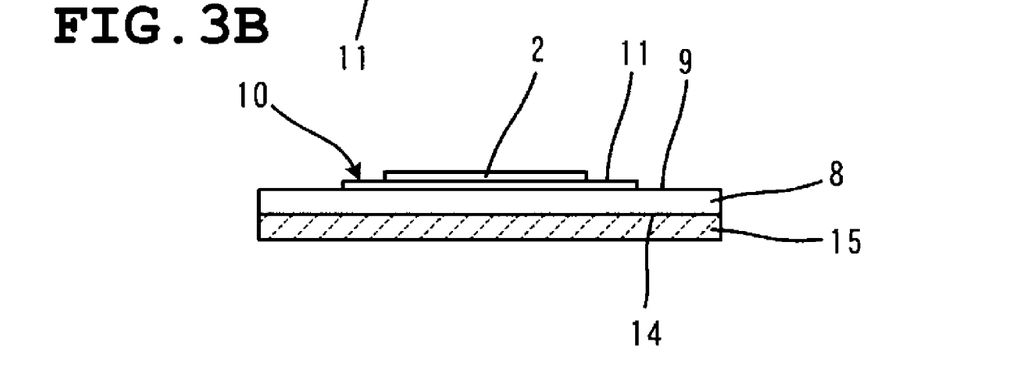

As showing to FIGS. 3A and 3B, a flat core 2 with a thickness of, for example, about 50 μm to about 300 μm is prepared. The core 2 is made of a sintered compact of magnetic ceramic, such as ferrite, and preferably has been fired at a temperature greater than the firing temperature of a below-described multilayer composite.

Then, the core 2 is disposed on the first main surface 9 of the first ceramic green sheet 8, as shown in FIGS. 3A and 3B. At this time, the core 2 is arranged such that the ends of the first conductor pattern 10, more specifically the ends of each of the plurality of conductive strips 11, protrude from the core 2. Preferably, the core 2 is temporarily bonded to the first ceramic green sheet 8 with an adhesive to prevent displacement thereof at this stage.

Figure 4A:
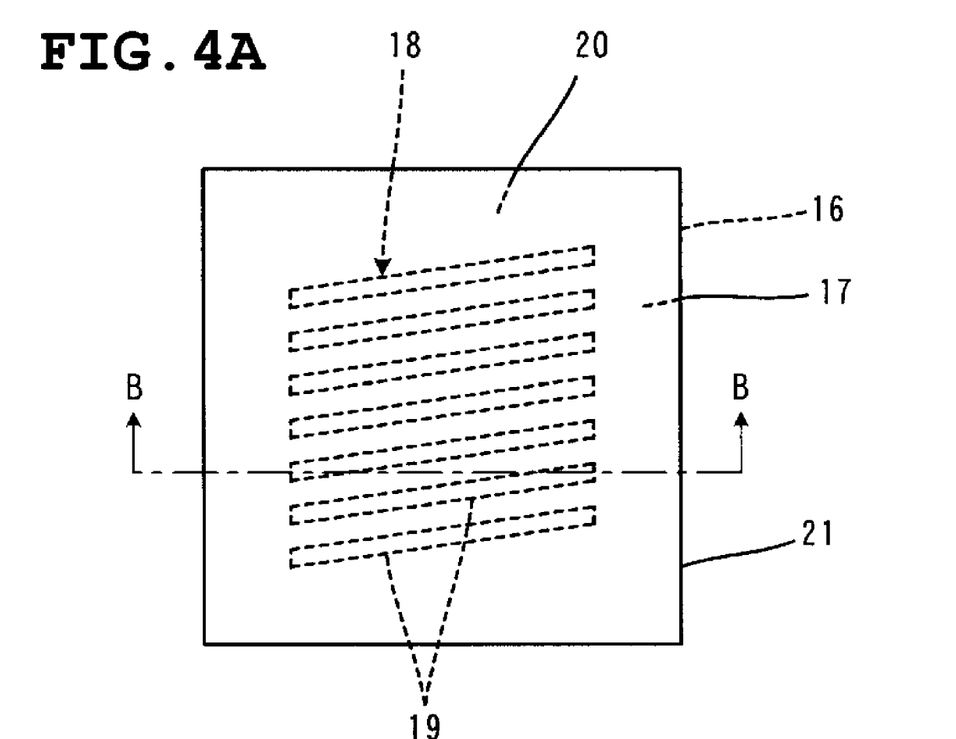
Figure 4B:
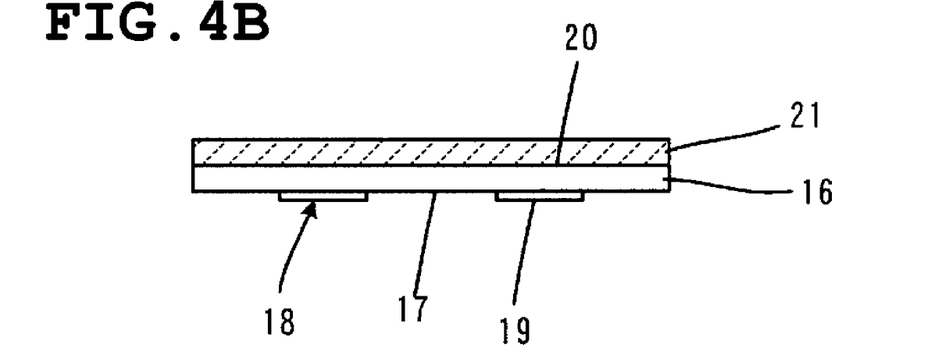

As shown in FIGS. 4A and 4B, a second ceramic green sheet 16 is prepared. The second ceramic green sheet 16 is for the ceramic layer 5 shown in FIG. 1. A second conductor pattern 18 for another portion of the coil conductor 3 is formed on a first main surface (surface facing downward in FIG. 4B) 17 of the second ceramic green sheet 16. The second conductor pattern 18 has a plurality of conductive strips 19 arranged substantially parallel to each other.

A shrinkage restraining layer 21 is formed on a second main surface 20 of the second ceramic green sheet 16 opposite the first main surface 17.

The second ceramic green sheet 16, the second conductor pattern 18, and the shrinkage retardant layer 21 are preferably made of substantially the same materials as the foregoing first ceramic green sheet 8, the first conductor pattern 10, and the shrinkage retardant layer 15, respectively, in the same process.

Figure 5A:
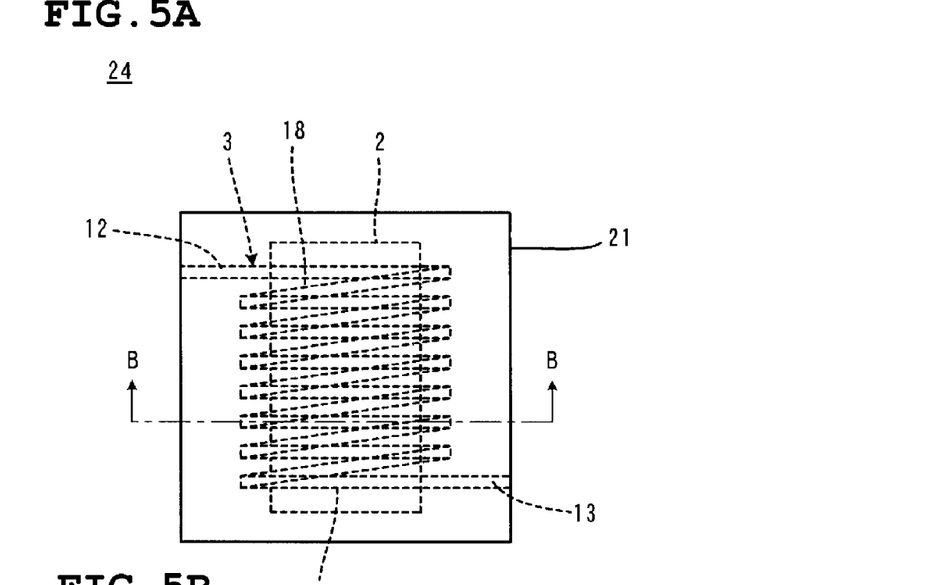
Figure 5B:
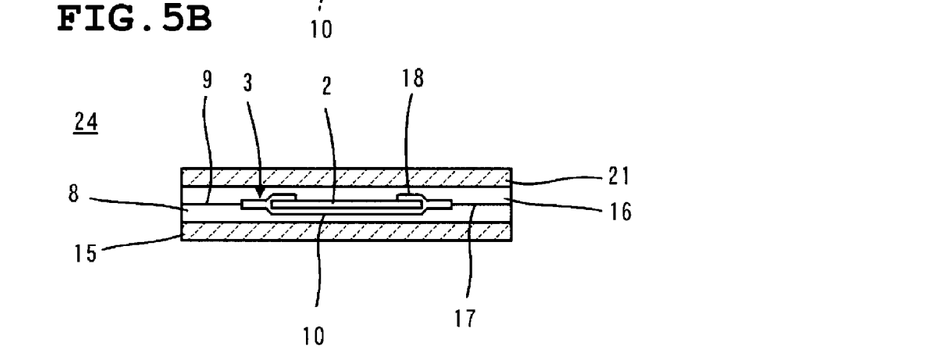

As shown in FIGS. 5A and 5B, the structure shown in FIGS. 3A and 3B and the structure shown in FIGS. 4A and 4B are stacked. More specifically, the first ceramic green sheet 8 and the second ceramic green sheet 16 are stacked such that the first main surface 9 of first ceramic green sheet 8 opposes the first main surface 17 of the second ceramic green sheet 16 with the core 2 being disposed therebetween, and such that the ends of the first conductor pattern 10 are in contact with the ends of the second conductor pattern 18 to define a conductor having a coil shape. As a result, the ends of each conductive strip 11 of the first conductor pattern 10 are in contact with the ends of the corresponding conductive strip 19 of the second conductor pattern 18, thus providing a conductor having a coil shape with a plurality of turns.

Thus, a multilayer composite 24 as shown in FIGS. 5A and 5B is produced. In the multilayer composite 24, and the first and second ceramic green sheets 8 and 16 define first and second green ceramic layers, respectively. Accordingly, reference numerals "8" and "16" respectively designating the first and second ceramic green sheets also designate the first and second green ceramic layers.

The multilayer composite 24 includes the core 2 made of a magnetic ceramic sintered compact, the coil conductor 3 disposed around the core 2, the first and second green ceramic layers 8 and 16 between which the coil 2 and the coil conductor 3 are disposed, and the shrinkage restraining layers 15 and 21 in contact with the green ceramic layers 8 and 16, respectively.

The multilayer composite 24 is subsequently pressed in the stacking direction and fired in a predetermined atmosphere at a temperature at which the green ceramic layers 8 and 16 are sintered. Then, the shrinkage restraining layers 15 and 21 are removed to complete the inductor element 1 as shown in FIG. 1.

Since the core 2 is made of a sintered compact, the constituents of the core 2, coil conductor 3, and green ceramic layers 8 and 16 do not substantially diffuse between the core 2 and the coil conductor 3 and green ceramic layers 8 and 16 in the above-described firing step. Accordingly, the core 2 maintains the material characteristics inherent in its magnetic ceramic sintered compact.

In the firing step, the shrinkage restraining layers 15 and 21 prevent the green ceramic layers 8 and 16 from shrinking. Consequently, a warp or a wave does not occur in the resulting inductor element 1, and thus, the inductor element 1 is manufactured with a high yield.

The shrinkage restraining layers 15 and 21 defining the outermost layers are not sintered in the firing step, and accordingly, they can be easily removed. The shrinkage restraining layers 15 and 21 may have such a small thickness that a portion of the constituents of the green ceramic layers 8 and 16 permeate into the shrinkage restraining layers 15 and 21 so as to be solidified in the firing step. In this instance, the shrinkage restraining layers 15 and 21 remain in the inductor element 1. The shrinkage restraining layers may be formed along the interfaces between, for example, the green ceramic layers 8 and 16 and the coil conductor 13. Also, only one of the shrinkage restraining layers 15 and 21 defining the outermost layers may be provided.

External terminal electrodes, not shown in FIGS. 1 to 5B, are provided on the outer surfaces of the inductor element 1 and electrically connected to the respective input/output terminals 12 and 13 of the coil conductor 3.

Figure 6:
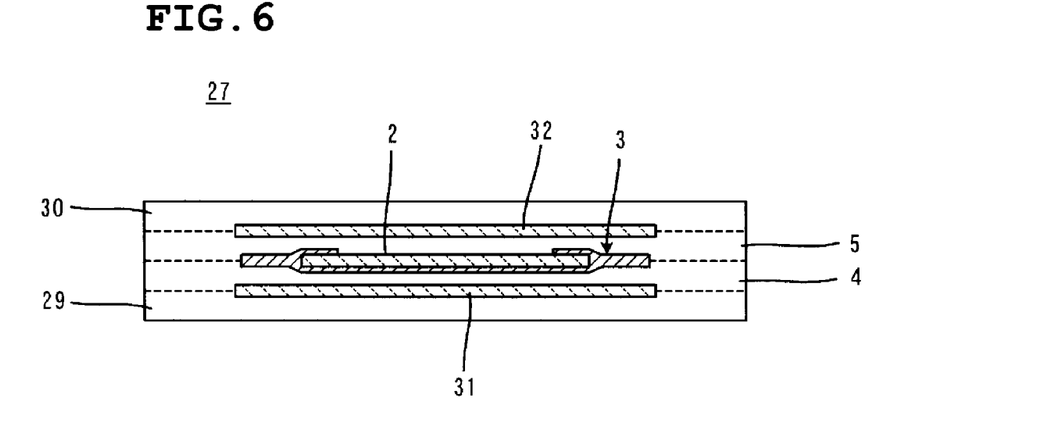
FIG. 6 is a sectional view of an inductor element according to a second preferred embodiment of the monolithic ceramic electronic component manufactured by the manufacturing method of the present invention.
Figure 7:
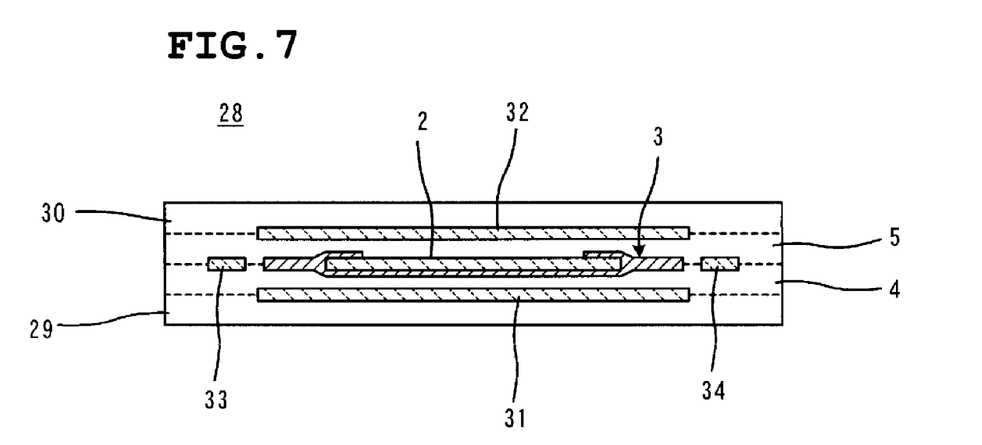
FIG. 7 is a sectional view of an inductor element according to a third preferred embodiment of the monolithic ceramic electronic component manufactured by the manufacturing method of the present invention.

FIGS. 6 and 7 are sectional views corresponding to FIG. 1 of inductor elements 27 and 28 according to second and third preferred embodiments of the monolithic ceramic electronic component manufactured by a manufacturing method of the present invention. In FIGS. 6 and 7, the same portions as those shown in FIG. 1 are designated by the same reference numerals and the description is omitted.

Each of the inductor elements 27 and 28 shown in FIGS. 6 and 7 includes ceramic layers 29 and 30, in addition to the ceramic layers 4 and 5.

In the inductor element 27 shown in FIG. 6, shield plates 31 and 32 made of a magnetic ceramic sintered compact are disposed along the respective interfaces between the ceramic layers 4 and 29 and between the ceramic layers 5 and 30 such that the core 2 and the coil conductor 3 are disposed between the shield plates 31 and 32 in the stacking direction.

In the inductor element 28 show in FIG. 7, shield plates 33 and 34 made of a magnetic ceramic sintered compact are provided in addition to the shield plates 31 and 32 at the interface of the ceramic layers 4 and 5 between which the core 2 and the coil conductor 3 are disposed, such that the core 2 and the coil conductor 3 are disposed between the shield plates 33 and 34.

The multilayer composite for manufacturing the inductor elements 27 and 28 includes green ceramic layers for the ceramic layers 4, 5, 29, and 30. The shield plates 31 to 34 made of a magnetic ceramic sintered compact are disposed along the interfaces of those green ceramic layers.

In the multilayer composite formed for manufacturing the inductor elements 27 and 28, the shield plates 31 and 32 made of a magnetic ceramic sintered compact have a relatively large area and are disposed along a specific interface of the green ceramic layers. The shield plates 31 and 32, in addition to the shrinkage restraining layers, prevent shrinkage in the firing step.

In the inductor element 27 shown in FIG. 6, the shield plates 31 and 32 confine lines of magnetic force, and accordingly, reduce the loss. In the inductor element 28 shown in FIG. 7, the additional shield plates 33 and 34 further confine the lines of magnetic force, and accordingly, further reduce the loss.

The inductor element 27 shown in FIG. 6 may include only one of the shield plates 31 and 32. The inductor element 28 shown in FIG. 7 may include only one of the shield plates 31 to 34.

Figure 8:
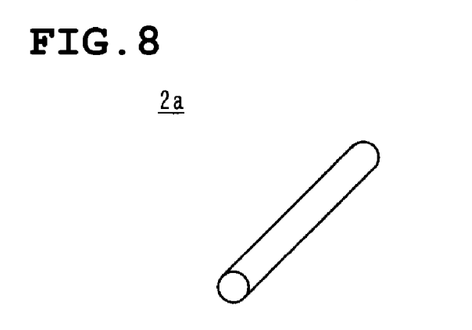
FIG. 8 is a perspective view of a core used as an alternative to the core used in the inductor elements shown in FIGS. 1, 6, and 7, respectively.
Figure 9:
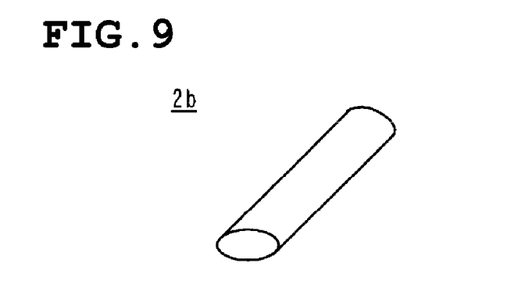
FIG. 9 is a perspective view of a core used as an alternative to the core used in the inductor elements shown in FIGS. 1, 6, and 7 respectively.

FIGS. 8 and 9 are perspective views of alternatives to the core 2 used in the inductor elements 1, 27, and 28.

Each of the inductor elements 1, 27, and 28 utilize the flat core 2. This type of core 2 is preferably thin, and has the advantage that the shrinkage behavior during firing coincides with that of the green ceramic layers 8 and 16 between which the core is disposed.

On the other hand, the core 2a shown in FIG. 8 preferably has a substantially circular cylinder shape with a substantially circular cross-section. This type of core does not concentrate the magnetic flux. The use of such a core 2a advantageously reduces the loss in the coil conductor 3.

The core 2b shown in FIG. 9 preferably has a substantially elliptical cylinder shape with a substantially elliptical cross-section. Such a core 2b exhibits the same effect as the foregoing core 2a and is easier to handle than the substantially circularly cylindrical core 2a. Also, the behavior of shrinkage of the core 2b coincides with the behavior of the green ceramic layers during firing.

FIGS. 10 to 13 show successive steps of a process for forming a multilayer composite 37 for manufacturing an inductor element according to a fourth preferred embodiment of a monolithic ceramic electronic component. FIGS. 10, 11, 12, and 13 are plan views corresponding to FIGS. 2A, 3A, 4A, and 5A, respectively.

The process for forming the multilayer composite 37 will be described below. The multilayer composite 37 can be formed with substantially the same process as the multilayer composite 24 described with reference to FIGS. 2A to 5B, unless otherwise noted.

Figure 10:
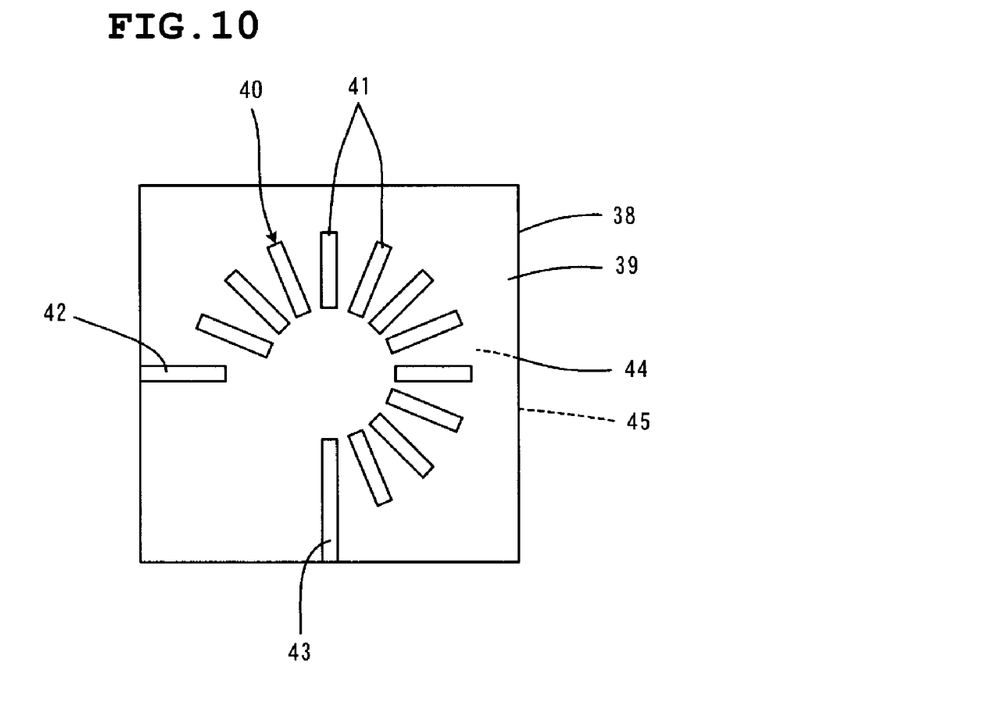
FIG. 10 is representation of a first ceramic green sheet prepared for manufacturing a multilayer composite shown in FIGS. 3A and 3B prepared for manufacturing an inductor element according to a fourth preferred embodiment of the monolithic ceramic electronic component, corresponding to FIG. 2A.

First, a first ceramic green sheet 38 for a ceramic layer is prepared, as shown in FIG. 10. A first conductor pattern 40 for a portion of a coil conductor is formed on a first main surface 39 of the first ceramic green sheet 38. The first conductor pattern 40 includes a plurality of conductive strips 41 arranged in a substantially circular arc form. The first conductor pattern 40 also includes input/output terminals 42 and 43. The input/output terminals 42 and 43 are formed so as to reach the edges of the first ceramic green sheet 38.

A shrinkage restraining layer 45 is formed on a second main surface (surface facing downward in FIG. 10) 44 of the first ceramic green sheet 38 opposite the first main surface 39. In FIG. 10, the shrinkage restraining layer 45 is hidden under the first ceramic green sheet 38.

Figure 11:
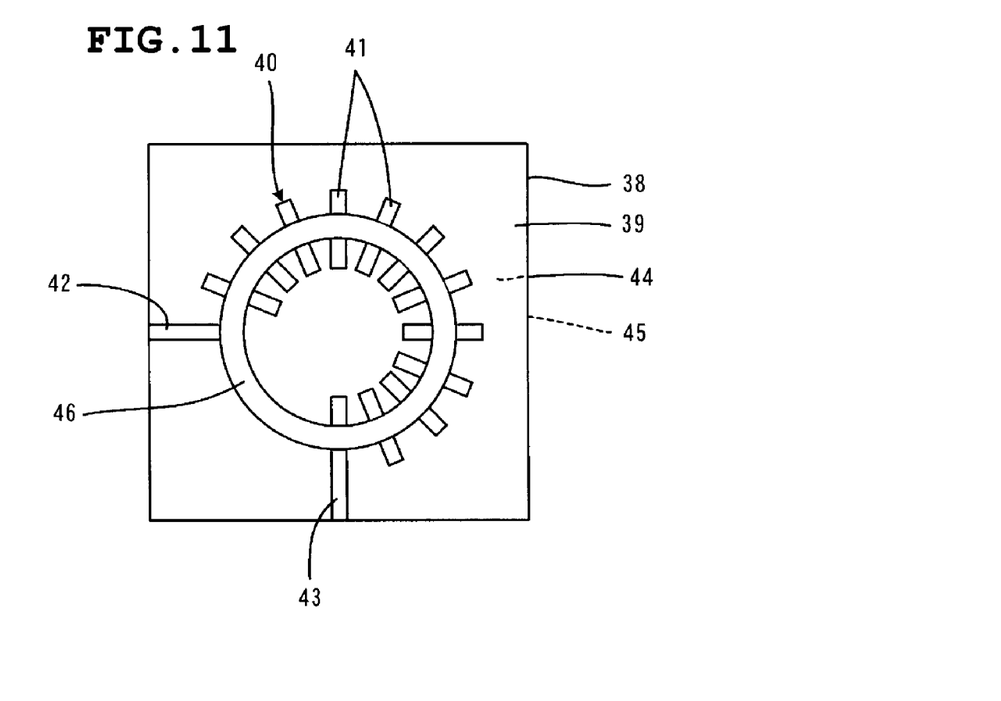
FIG. 11 is a representation of the state where a core is disposed on the ceramic green sheet shown in FIG. 10, corresponding to FIG. 3A.

As shown to FIG. 11, a ring-shaped core 46 is prepared. The core 46 is preferably made of a sintered compact of magnetic ceramic, such as ferrite. The core 46 may have a substantially rectangular shape or any other suitable shape, such as circle or ellipse.

Then the core 46 is disposed on the first main surface 39 of the first ceramic green sheet 38, as shown in FIG. 11. At this time, the core 46 is arranged such that the ends of the first conductor pattern 40, more specifically the ends of each of the plurality of conductive strips 41, protrude from the core 46.

Figure 12:
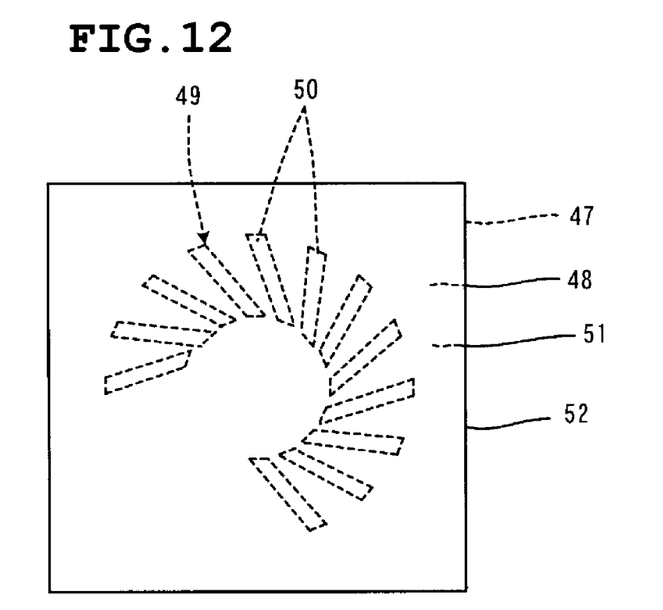
FIG. 12 is a representation corresponding to FIG. 4A of a second ceramic green sheet prepared for forming a multilayer composite shown in FIG. 13.

As shown to FIG. 12, a second ceramic green sheet 47 intended for a ceramic layer is prepared. A second conductor pattern 49 intended for the other part of the coil conductor is formed on a first main surface (surface facing downward in FIG. 12) 48 of the second ceramic green sheet 47. The second conductor pattern 49 includes a plurality of conductive strips 50 arranged in a substantially circular arc arrangement.

A shrinkage restraining layer 52 is formed on the second main surface (surface facing upward in FIG. 12) 51 of the second ceramic green sheet 47 opposite the first main surface 48. In FIG. 12, the second ceramic green sheet 47 is hidden under the shrinkage restraining layer 52.

Figure 13:
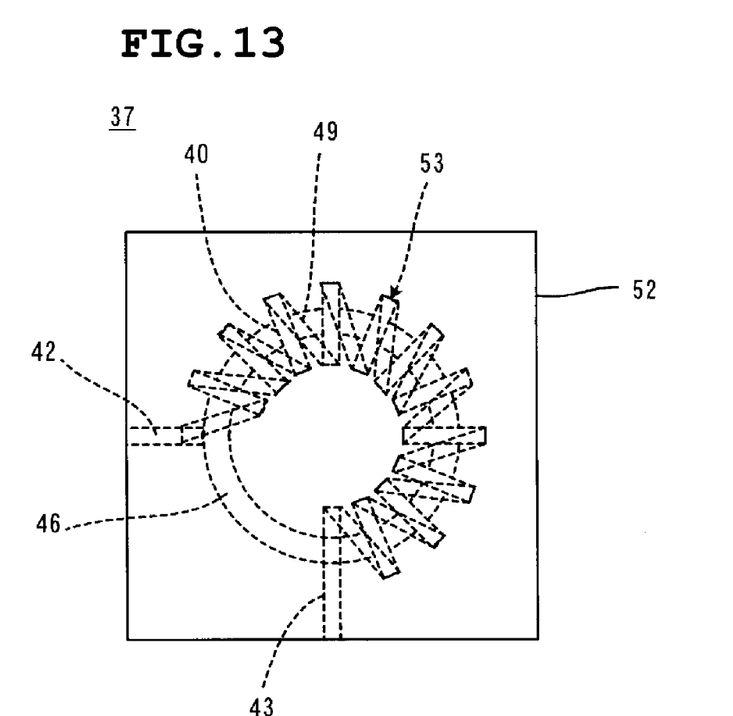
FIG. 13 is a representation corresponding to FIG. 5A of the multilayer composite formed by stacking the structure shown in FIG. 11 and the structure shown in FIG. 12.

Then, the structure shown in FIG. 11 and the structure shown in FIG. 12 are stacked, as shown in FIG. 13. More specifically, the first ceramic green sheet 38 and the second ceramic green sheet 47 are stacked such that the first main surface 39 of the first ceramic green sheet 38 opposes the first main surface 48 of the second ceramic green sheet 47 with the core 46 therebetween, and such that the ends of the first conductor pattern 40 are in contact with the ends of the second conductor pattern 49 to define a conductor having a coil shape.

As a result, the ends of each conductive strip 41 of the first conductor pattern 40 are in contact with the ends of the corresponding conductive strip 50 of the second conductor pattern 49, thus defining a coil conductor 53 having a plurality of turns and extending along the ring-shaped core 46.

The resulting multilayer composite 37 is subjected to a pressing step, a firing step, the step of removing the shrinkage restraining layers 45 and 52, and the step of forming an external terminal electrode, thus producing the intended inductor element.

While the present invention has been described with reference to the method for manufacturing a single-function inductor element functioning as an inductor, the present invention can be applied to a method for manufacturing a multilayer ceramic substrate having a plurality of functions including the function of an inductor. Preferred embodiments in which the present invention is applied to a method for manufacturing such a multilayer ceramic substrate will now be described.

Figure 14:
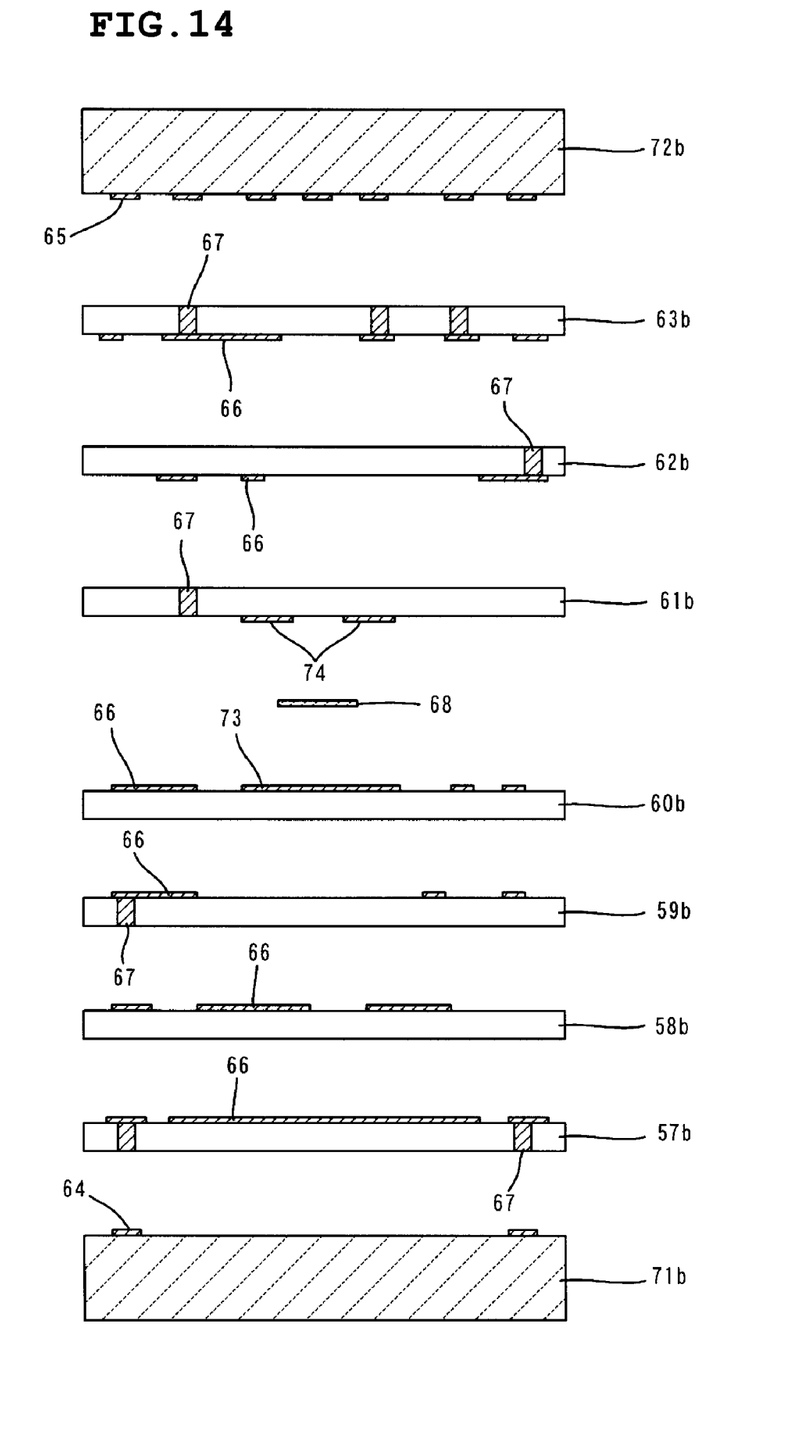
FIG. 14 is a sectional view separately showing ceramic green sheets and shrinkage restraining green sheets that are prepared for forming a multilayer composite 56 shown in FIG. 15.
Figure 15:
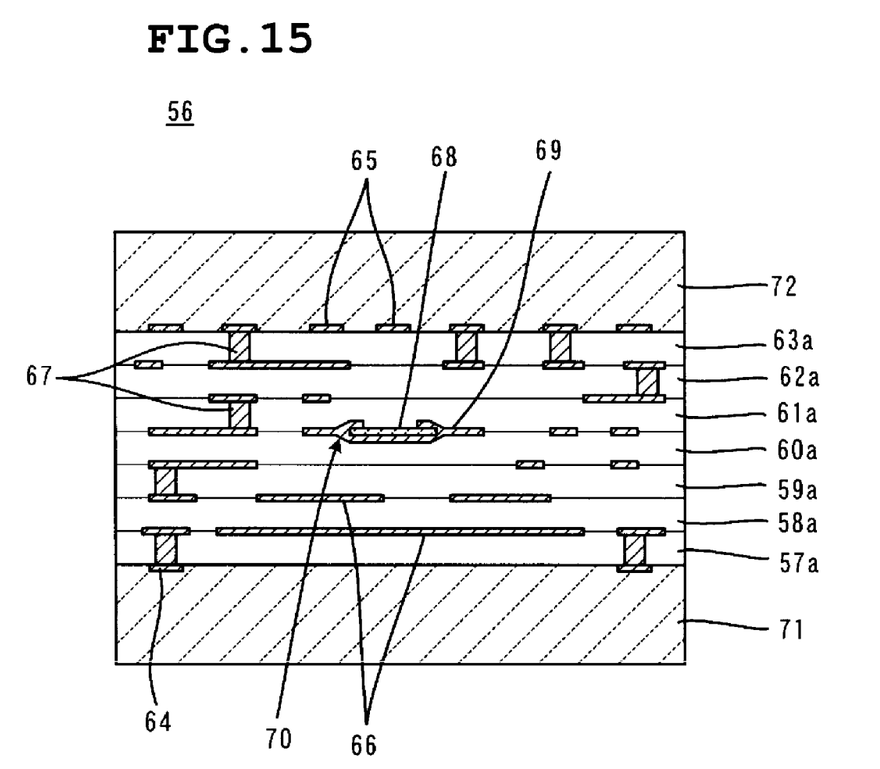
FIG. 15 is a sectional view of the multilayer composite formed by stacking the ceramic green sheets and the shrinkage restraining green sheets shown in FIG. 14.
Figure 16:
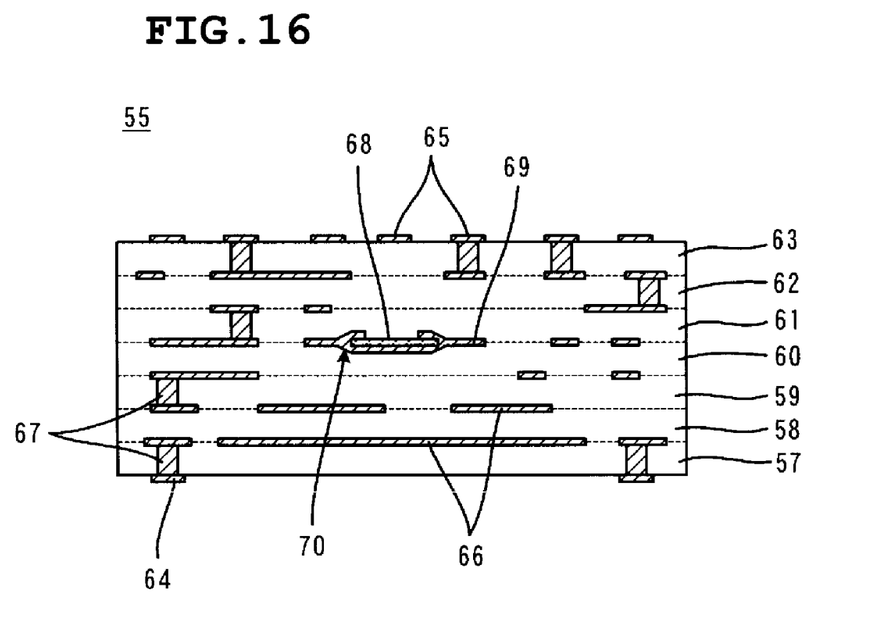
FIG. 16 is a sectional view of a multilayer ceramic substrate completed by firing the multilayer composite shown in FIG. 15.

FIGS. 14 to 16 are sectional views of a manufacturing method of a multilayer ceramic substrate 55 according to a fifth preferred embodiment of the monolithic ceramic electronic component.

The multilayer composite 56 shown in FIG. 15 is formed for manufacturing the multilayer ceramic substrate 55 shown in FIG. 16. The multilayer composite 56 is divided into members shown in FIG. 14 before stacking. The method for manufacturing the inductor element 1 is used for the method for manufacturing the multilayer ceramic substrate 55, unless otherwise noted.

First, the structure of the multilayer ceramic substrate 55 will be described with reference to FIG. 16.

The multilayer ceramic substrate 55 includes a plurality of ceramic layers 57 to 63. The multilayer ceramic substrate 55 also has wiring conductors including some external conductor films 64 and 65 provided on its main surfaces, internal conductor films 66 provided at specific interfaces between the ceramic layers 57 to 63, and some via hole conductors 67 passing through specific ones of the ceramic layers 57 to 63.

At least some of these wiring conductors define a passive element, such as a capacitor or an inductor.

The multilayer ceramic substrate 55 includes an inductor element 70 including a flat core 68 and a coil conductor 69 disposed around the core 68. The inductor element 70 is disposed between the ceramic layers 60 and 61. The inductor element 70 has substantially the same structure as the above-described single-function inductor element 1.

The multilayer composite 56 formed for manufacturing such a multilayer ceramic substrate 55 will now be described with reference to FIGS. 14 and 15. In FIGS. 14 and 15, the same portions as those shown in FIG. 16 are designated by the same reference numerals and the description is not repeated.

As is clear from a comparison of FIGS. 15 and 16, the multilayer composite 56 shown in FIG. 15 includes green ceramic layers 57a to 63a corresponding to the ceramic layers 57 to 63, respectively. The external conductor films 64 and 65, the internal conductor films 66, and the via hole conductors 67 are provided in relation to these green ceramic layers 57a to 63a. The inductor element 70 including the core 68 and the coil conductor 69 is disposed between the green ceramic layers 60a and 61a. In addition, shrinkage restraining layers 71 and 72 are disposed so as to define the outermost layers of the multilayer composite 56.

In order to form the multilayer composite 56 as shown in FIG. 15, the ceramic green sheets 57b to 63b respectively corresponding to the green ceramic layers 57a to 63a are prepared, as shown in FIG. 14, and shrinkage restraining green sheets 71b and 72b respectively corresponding to the shrinkage restraining layers 71 and 72 are prepared. In addition, the flat core 68 made of a magnetic ceramic sintered compact is prepared.

Then, via hole conductors 67 are formed in specific ones of the ceramic green sheets 57b to 63b. Internal conductor films 66 are formed on the upper main surfaces of the ceramic green sheets 57b to 60b under the core 68 and on the lower main surfaces of the ceramic green sheets 61b to 63b over the core 68. At least some of the internal conductor films 66 on the upper main surface of the ceramic green sheet 60b may be provided on the lower main surface of the ceramic green sheet 61b.

The external conductor films 64 are formed on the upper main surface of the shrinkage restraining green sheet 71b, while the external conductor films 65 are formed on the lower main surface of the shrinkage restraining green sheet 72b. These external conductor films 64 and 65 will be transferred to the ceramic green sheets 57b and 63b, respectively, in a subsequent step. The reason why the external conductor films 64 and 65 are provided on the shrinkage restraining green sheets 71b and 72b is to avoid the necessity for conductor films which must be aligned on both the main surfaces of the ceramic green sheets 57b and 63b.

In addition, the first conductor pattern 73 for a portion of the coil conductor 69 is formed on the upper main surface of the ceramic green sheet 60b, and the second conductor pattern 74 for another portion of the coil conductor 69 is formed on the lower main surface of the ceramic green sheet 61b. The first and second conductor patterns 73 and 74 have substantially the same shape as the first and second conductor patterns 10 and 18 shown in FIGS. 2A to 5B.

Subsequently, a stacking step is performed as described below to form the multilayer composite 56 shown in FIG. 15.

Referring to FIG. 14, the ceramic green sheets 57b to 60b are stacked on the shrinkage restraining green sheet 71b one after another. The resulting stack is pressed in the stacking direction at a pressure of about 20 MPa to about 150 MPa.

Then, the core 68 is disposed on the ceramic green sheet 60b. At this time, the core 68 is arranged such that the ends of the first conductor pattern 73 protrude from the core 68. The core 68 is temporarily bonded to the ceramic green sheet 60b with an adhesive or other suitable bonding agent.

Also, the ceramic green sheets 63b to 61b are stacked on the shrinkage restraining green sheet 72b one after another. The resulting stack is pressed in the stacking direction at a pressure of, for example, about 20 MPa to about 150 MPa.

Then, the stack including the shrinkage restraining green sheet 71b, the ceramic green sheets 57b to 60b, and the core 68 and the stack including the shrinkage restraining green sheet 72b and the ceramic green sheets 61b to 63b are disposed one on top of the other with the ceramic green sheets 60b and 61b opposing each other. The entire structure is pressed in the stacking direction at a pressure of, for example, about 20 MPa to about 200 MPa.

Thus, the multilayer composite 56 shown in FIG. 15 is produced.

Then, a firing step is performed in which the multilayer composite 56 is fired at a temperature at which the green ceramic layers 57a to 63a are sintered in a predetermined atmosphere. After firing, the shrinkage restraining layers 71 and 72 are removed, and thus, the multilayer ceramic substrate 55 shown in FIG. 16 is produced. By applying a pressure of about 50 kPa to about 1000 kPa to the multilayer composite 56 in the stacking direction in the firing step, the resulting multilayer ceramic substrate 55 has superior evenness. Then, the external conductor films 64 and 65 are plated as required.

Figure 17:
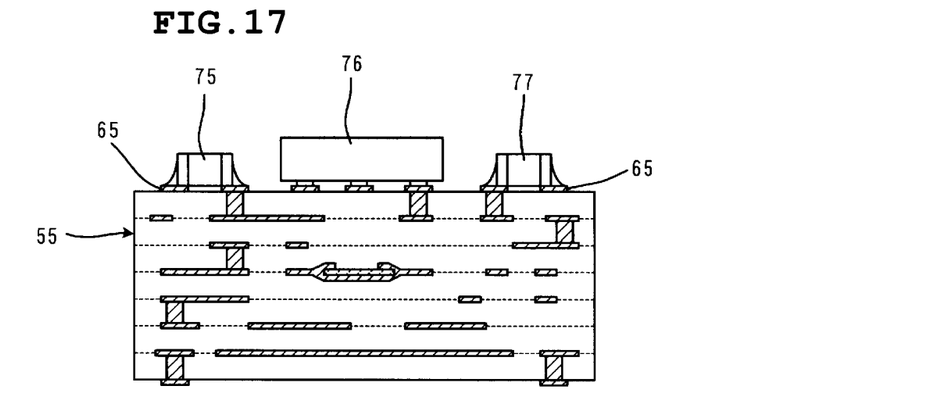
FIG. 17 is a sectional view of the state in which surface mount components are mounted on the multilayer ceramic substrate shown in FIG. 16.

FIG. 17 shows the multilayer ceramic substrate 55 shown in FIG. 16 on which surface mount components 75 to 77 are mounted. The surface mount components 75 to 77 are surface-mounted on the multilayer ceramic substrate 55 so as to be electrically connected to the external conductor films 65 by soldering.

Figure 18:
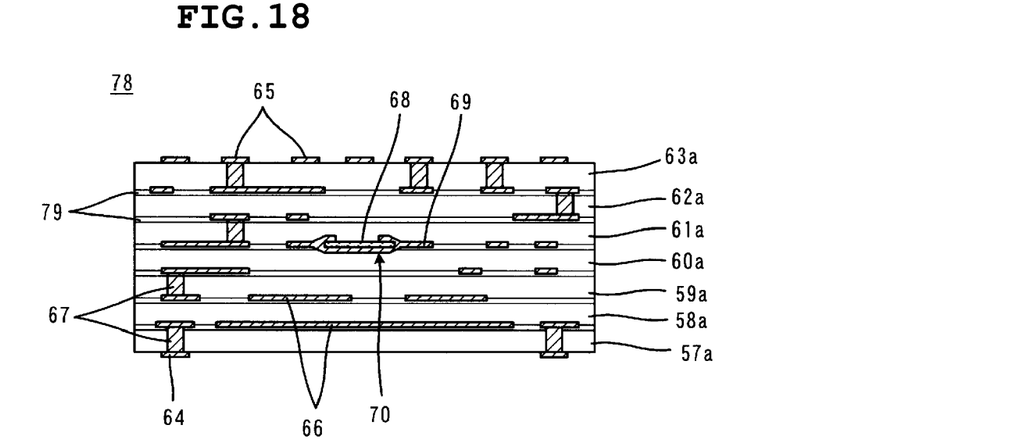
FIG. 18 is a sectional view of a multilayer composite formed for manufacturing a multilayer ceramic substrate according to a sixth preferred embodiment of the monolithic ceramic electronic component.

FIG. 18 is a sectional view of a multilayer composite 78 for manufacturing a multilayer ceramic substrate according to a sixth preferred embodiment of the monolithic ceramic electronic component. The multilayer composite 78 shown in FIG. 18 is similar to the multilayer composite 56 shown in FIG. 15. In FIG. 18, the portions that are equivalent to those shown in FIG. 15 are designated by the same reference numerals, and the same description is not repeated.

In the multilayer composite 78 shown in FIG. 18, the shrinkage restraining layers 79 are disposed along the interfaces of the green ceramic layers 57a to 63a. The shrinkage restraining layers 79 have a relatively small thickness and are solidified by permeation of a portion of the constituents of the green ceramic layers 57a to 63a during firing. It is therefore not necessary to subsequently remove the shrinkage restraining layers 79.

While the shrinkage restraining layers 79 are preferably disposed at each interface of the green ceramic layers 57a to 63a in the preferred embodiment shown in FIG. 18, the shrinkage restraining layers 79 are not necessarily provided at every interface.

The multilayer composite 78 shown in FIG. 18 may further include shrinkage restraining layers defining outermost layers similar to the shrinkage restraining layers 71 and 72 shown in FIG. 15.

Figure 19:
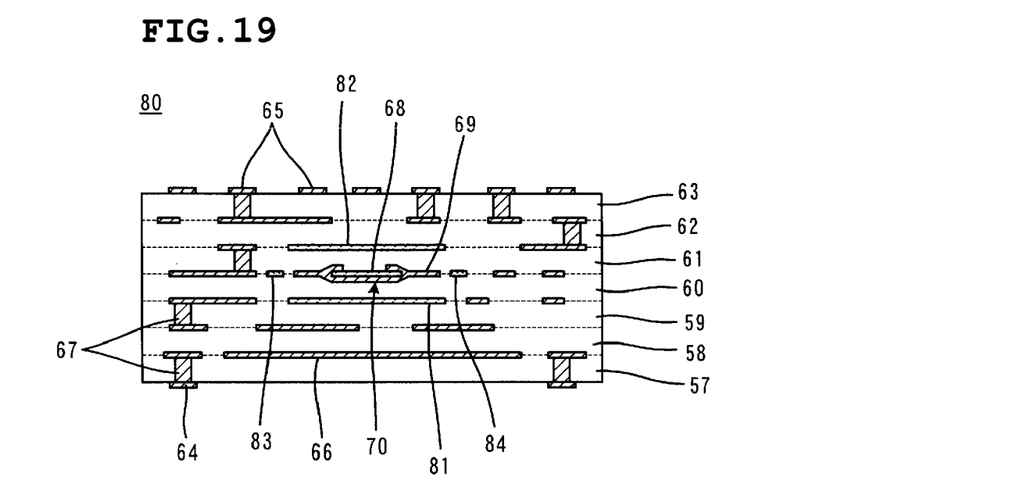
FIG. 19 is a sectional view of a multilayer ceramic substrate according to a seventh preferred embodiment of the monolithic ceramic electronic component.

FIG. 19 is a sectional view of a multilayer ceramic substrate 80 according to a seventh preferred embodiment of the monolithic ceramic electronic component manufactured by the method according to the present invention. The multilayer ceramic substrate 80 shown in FIG. 19 is similar to the multilayer ceramic substrate 55 shown in FIG. 16. In FIG. 19, the portions equivalent to those shown in FIG. 16 are designated by the same reference numerals and the same description is not repeated.

In the multilayer ceramic substrate 80 shown in FIG. 19, the inductor element 70 has substantially the same structure as the inductor element 28 shown in FIG. 7.

Specifically, first shield plates 81 and 82 made of a magnetic ceramic sintered compact are disposed along the interfaces between the ceramic layers 59 and 60 and between the ceramic layers 61 and 62 so that the core 68 and the coil conductor 69 are sandwiched by the first shield pates 81 and 82. In addition, second shield plates 83 and 84 are disposed at the interface of the ceramic layers 60 and 61 between which the core 68 and the coil conductor 69 are disposed, such that the core 68 and the coil conductor 69 are disposed between the second shield plates 83 and 84.

These shield plates 81 to 84 have substantially the same function as the shield plates 31 to 34 shown in FIG. 7.

The multilayer composite formed for manufacturing the multilayer ceramic substrate 80 in the present preferred embodiment has a structure in which the shield plates 81 to 84 are disposed at specific interfaces of the green ceramic layers, similar to the inductor element 28 shown in FIG. 7.

While the present invention has been described with reference to preferred embodiments shown in the drawings, various modifications may be made without departing from the scope of the present invention.

For example, the coil conductor may be modified into a variety of different shapes. The wiring conductors of the multilayer ceramic substrate may also be modified as required.

The arrangement of the inductor element may be modified in the multilayer ceramic substrate. At least two inductor elements may be embedded in the multilayer ceramic substrate. In this instance, a plurality of inductor elements may be disposed along some interfaces of the ceramic layers of the multilayer ceramic substrate, or along a single interface of the ceramic layers.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a monolithic ceramic electronic component including an inductor element, the method comprising:
   a step of forming a multilayer composite that includes a core made of a magnetic ceramic sintered compact, a coil conductor formed around the core, at least two green ceramic layers laminated such that the core and the coil conductor are sandwiched therebetween, and a shrinkage restraining layer arranged in contact with at least one of the green ceramic layers and including an inorganic material powder that is not substantially sintered at a sintering temperature of the green ceramic layers; and
   the step of firing the multilayer composite at the sintering temperature of the green ceramic layers.

2. The method for manufacturing the monolithic ceramic electronic component according to claim 1, wherein the step of forming the multilayer composite includes:
   a step of preparing the core;
   a step of preparing a plurality of ceramic green sheets for the green ceramic layers;
   a step of forming a first conductor pattern for a portion of the coil conductor on a first main surface of a first one of the ceramic green sheets;
   a step of forming a second conductor pattern for another portion of the coil conductor on a first main surface of a second one of the ceramic green sheets; and
   a step of stacking the first ceramic green sheet and the second ceramic green sheet such that the first main surface of the first ceramic green sheet opposes the first main surface of the second ceramic green sheet with the core therebetween, and such that ends of the first conductor pattern are in contact with ends of the second conductor pattern to define a conductor having a coil shape.

3. The method for manufacturing the monolithic ceramic electronic component according to claim 2, wherein the step of stacking the first ceramic green sheet and the second ceramic green sheet includes:
   a step of disposing the core on the first main surface of the first ceramic green sheet such that the ends of the first conductor pattern protrude from the core; and
   a step of stacking the second ceramic green sheet on the first ceramic green sheet with the core therebetween.

4. The method for manufacturing the monolithic ceramic electronic component according to claim 2, wherein the step of forming the multilayer composite further includes a step of forming the shrinkage restraining layer on a second main surface opposite the first main surface of the first ceramic green sheet and a second main surface opposite the first main surface of the second ceramic green sheet.

5. The method for manufacturing the monolithic ceramic electronic component according to claim 2, wherein each of the first and second conductor patterns includes a plurality of conductive strips, such that the coil conductor includes a plurality of turns.

6. The method for manufacturing the monolithic ceramic electronic component according to claim 1, wherein the core is one of a flat plate, a substantially circular cylinder, a substantially elliptical cylinder, and a ring.

7. The method for manufacturing the monolithic ceramic electronic component according to claim 1, wherein the shrinkage restraining layer is arranged so as to define an outermost layer of the multilayer composite, and the method further includes a step of removing the shrinkage restraining layer after the step of firing.

8. The method for manufacturing the monolithic ceramic electronic component according to claim 1, wherein the shrinkage restraining layer is disposed at a specific interface of the green ceramic layers, and the shrinkage restraining layer is solidified by permeation of a portion of constituents of the green ceramic layers in the step of firing.

9. The method for manufacturing the monolithic ceramic electronic component according to claim 1, wherein the multilayer composite further includes first shield plates made of a magnetic ceramic sintered compact disposed along specific interfaces of the green ceramic layers such that the core and the coil conductor are disposed between the first shield plates in the stacking direction.

10. The method for manufacturing the monolithic ceramic electronic component according to claim 9, wherein the multilayer composite further includes second shield plates made of a magnetic ceramic sintered compact and arranged such that the core and the coil conductor are sandwiched therebetween, at the interface of the green ceramic layers in which the core and the coil conductor are disposed.

11. The method for manufacturing the monolithic ceramic electronic component according to claim 1, wherein the monolithic ceramic electronic component is a single-function element having a function of an inductor.

12. The method for manufacturing the monolithic ceramic electronic component according to claim 11, wherein the green ceramic layers primarily include one of a low-temperature co-fired ceramic material and a magnetic material.

13. The method for manufacturing the monolithic ceramic electronic component according to claim 1, wherein the monolithic ceramic electronic component is a multilayer ceramic substrate having a plurality of functions including a function of an inductor.

14. The method for manufacturing the monolithic ceramic electronic component according to claim 13, wherein the green ceramic layers primarily include a low-temperature co-fired ceramic material.

\* \* \* \* \*